United States Patent
Broekaart et al.

(10) Patent No.: US 6,939,812 B2
(45) Date of Patent: Sep. 6, 2005

(54) METHOD OF FORMING AN ETCH STOP LAYER IN A SEMICONDUCTOR DEVICE

(75) Inventors: Marcel Eduard Irene Broekaart, Nijmegen (NL); Josephus Franciscus Antonius Maria Guelen, Nijmegen (NL); Eric Gerritsen, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/804,004

(22) Filed: Mar. 12, 2001

(65) Prior Publication Data

US 2001/0046784 A1 Nov. 29, 2001

(30) Foreign Application Priority Data

Mar. 13, 2000 (EP) .............................................. 00201166
May 31, 2000 (EP) .............................................. 00201928

(51) Int. Cl.[7] .......................................... H01L 21/302
(52) U.S. Cl. ...................... 438/740; 257/382; 257/383; 257/758
(58) Field of Search ................................ 438/740, 257, 438/260, 637, 612, 618, 622, 633, 687, 700, 253; 257/382, 383, 758

(56) References Cited

U.S. PATENT DOCUMENTS

| | | | |
|---|---|---|---|
| 5,451,543 A | | 9/1995 | Woo et al. .................. 437/195 |
| 5,641,712 A | * | 6/1997 | Grivna et al. ............... 438/624 |
| 5,880,018 A | * | 3/1999 | Boeck et al. |
| 6,159,845 A | * | 12/2000 | Yew et al. .................. 438/637 |
| 6,190,966 B1 | * | 2/2001 | Ngo et al. .................. 438/257 |
| 6,268,262 B1 | * | 7/2001 | Loboda ...................... 438/422 |
| 6,303,523 B2 | * | 10/2001 | Cheung et al. ............. 438/780 |
| 6,362,094 B1 | * | 3/2002 | Dabbaugh et al. .......... 438/637 |
| 6,413,854 B1 | * | 7/2002 | Uzoh et al. ................. 438/637 |
| 6,426,249 B1 | * | 7/2002 | Geffken et al. ............. 438/239 |
| 6,509,229 B1 | * | 1/2003 | Wang et al. ................ 438/257 |
| 6,593,632 B1 | * | 7/2003 | Avanzino et al. ........... 257/382 |
| 6,649,968 B2 | * | 11/2003 | Wolstenholme ............. 257/315 |
| 2003/0089992 A1 | * | 5/2003 | Rathi et al. ................. 257/762 |

FOREIGN PATENT DOCUMENTS

| | | |
|---|---|---|
| EP | 0725440 A2 | 8/1996 |
| EP | 1061156 A2 | 12/2000 |
| JP | 10321838 A | 12/1998 |

* cited by examiner

*Primary Examiner*—Hoai Pham
*Assistant Examiner*—Nathan W. Ha
(74) *Attorney, Agent, or Firm*—Peter Zawilski

(57) ABSTRACT

There is a method of manufacturing a semiconductor device. In an example embodiment, the method comprises applying a semiconductor substrate that is provided with a conductor at a surface. The conductor has a top surface portion and sidewall portions, of which at least the top surface portion is provided with an etch stop layer comprising silicon carbide. A dielectric layer is applied. A via is etched in the dielectric layer over the conductor and, and stopping on the etch stop layer to create an exposed part of the etch stop layer. Inside the via from at least the top surface portion of the conductor, the exposed part of the etch stop layer is removed. The via is filled with a conductive material.

15 Claims, 2 Drawing Sheets

METHOD OF FORMING AN ETCH STOP LAYER IN A SEMICONDUCTOR DEVICE

Figure 1:
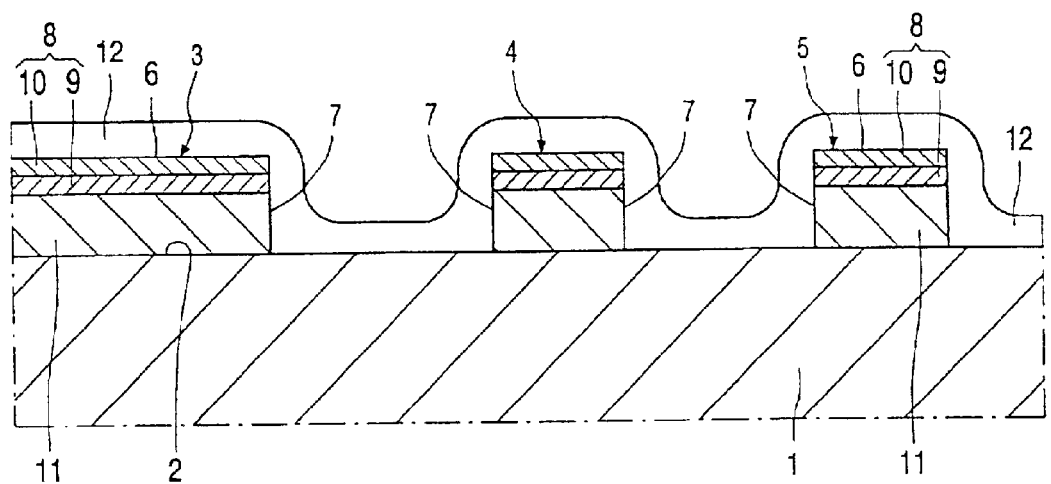

The invention relates to a method of manufacturing an electronic device, a semiconductor device in particular but not exclusively, which method comprises the steps of:

applying a semiconductor substrate which is provided with a conductor at a surface, the conductor having a top surface portion and sidewall portions, of which at least the top surface portion is provided with an etch stop layer, applying a dielectric layer, etching a via in the dielectric layer over the conductor, and stopping on the etch stop layer to create an exposed part of the etch stop layer, removing the exposed part of the etch stop layer inside the via from at least the top surface portion of the conductor, filling the via with a conductive material.

Such a method is known from U.S. Pat. No. 5,451,543, wherein a dielectric material, i.e. silicon nitride or aluminum oxide, or a conductive material, i.e. tungsten, titanium nitride or tantalum nitride, is used for the etch stop layer.

A disadvantage of the use of tungsten, titanium nitride or tantalum nitride for the etch stop layer is that metallic polymers are formed during etching of the via in the dielectric layer at the moment the etch chemistry interacts with the conductive material of the etch stop layer. The larger the difference in depths of the vias to be etched simultaneously in the dielectric layer, the more pronounced the above-mentioned metallic polymer formation takes place. Because these metallic polymers degrade the electrical via resistance, much effort has to be put in their removal, which is most efficiently done by etching using a wet chemistry. However, owing to their porous and otherwise unstable nature, most low-k materials appear to be incompatible with such wet etch chemistry, that is to say, their low-k properties are degraded. A disadvantage of the use of silicon nitride or aluminum oxide for the etch stop layer is that both materials have a relatively high dielectric constant compared to silicon oxide or a low-k material, which adversely affects the parasitic capacitance of the semiconductor device.

The invention has inter alia for its object to provide a method of manufacturing a semiconductor device of the kind mentioned in the opening paragraph, which method counteracts the formation of metallic polymers when the etch stop layer is reached during via etching and reduces the parasitic capacitance of the resulting semiconductor device.

According to the invention, this object is achieved in that a layer comprising silicon carbide is applied as the etch stop layer. Silicon carbide has a smaller dielectric constant than silicon nitride en aluminum oxide and, hence, provides a semiconductor device with a reduced parasitic capacitance. Moreover, the formation of metallic polymers during via etching is less pronounced, as silicon carbide is attacked to a lesser degree by the etch chemistry applied than is tungsten, titanium nitride and tantalum nitride.

The conductor having a top surface portion and sidewall portions, of which at least the top surface portion is provided with the etch stop layer, may be formed by depositing a stack of a conductive layer with on top thereof the etch stop layer, and subsequently patterning the stack. However, it is advantageous to form the conductor first by depositing a conductive layer and patterning it, and subsequently to apply the etch stop layer to the top surface portion and the sidewall portions of the conductor. In this way the conductor is encapsulated by the etch stop layer, which is advantageous during etching of a via which is unlanded, that is to say, a via which potentially falls off the conductor instead of completely landing on the top surface portion of the conductor. The etch stop layer present at the sidewall portions of the conductor counteracts interaction between the etch chemistry applied during etching of the unlanded via and the material of the conductor and, hence, counteracts formation of metallic polymers.

Further advantageous embodiments of the method in accordance with the invention are described in the dependent claims.

These and other aspects of the invention will be apparent from and be elucidated with reference to the embodiments described hereinafter and shown in the drawing. In the drawing:

FIGS. 1 to 4 show in diagrammatic cross-sectional views successive stages in the manufacture of a semiconductor device using the method in accordance with the invention.

FIG. 1 shows a portion of a semiconductor device which serves as an appropriate starting point for describing the method in accordance with the invention. The semiconductor device comprises a semiconductor substrate 1 which is provided with conductors 3,4,5 at a surface 2, which conductors 3,4,5 each have a top surface portion 6 and sidewall portions 7. It is noted that, although the invention is described in the context of three conductors and three vias, it is also applicable to just one conductor and one via. In reality, a semiconductor device will comprise a plurality of such conductors and vias. Although illustrated as one element, the semiconductor substrate 1 is actually likely to include multiple layers which are formed on, for example, a semiconductor body composed of, for example, silicon. For simplicity, the multiple layers together with the body, on which these layers are formed, are compositely illustrated as a single layer, namely semiconductor substrate 1. Functionally, the conductors 3,4,5 can be, for example, gates of a metal oxide semiconductor field effect transistor (MOSFET) or a thin film transistor (TFT), bases or emitters of a bipolar or BICMOS device, or can be part of, for example, a metal layer of a multi-level interconnect structure. The conductors 3,4,5 consist of a capping layer 8 on top of a base metal portion 11, the capping layer 8 thereby providing the top surface portion 6 of the conductors 3,4,5. The base metal portion 11 comprises aluminum in the present example. However, other materials such as, for example, copper or tungsten can be used as well. In the present example, a double layer consisting of a titanium layer 9 with on top thereof a titanium nitride layer 10 is applied as the capping layer 8. It is noted that the capping layer 8, which is usually applied to act as an anti-reflective coating during patterning of the base metal portion 11, is an optional part of the conductors 3,4,5. Another suitable material such as titanium tungsten, tungsten nitride and tantalum nitride may also be used instead of titanium nitride. Alternatively, the capping layer 8 may consist of a single layer of, for example, titanium nitride, titanium tungsten, tungsten nitride or tantalum nitride. In that situation, the capping layer 8 is advantageously removed inside the vias prior to filling the vias with conductive material, as high-resistant material may be formed due to interaction between the base metal portion 11 and the capping layer 8, which high-resistant material adversely affects the electrical via resistance.

The conductors 3,4,5 are formed in accordance with conventional processing. For example, a stack consisting of a layer of aluminum, a layer of titanium and a layer of titanium nitride is deposited on the surface 2 of the semiconductor substrate 1, which stack of layers is then patterned so as to form the conductors 3,4,5 of FIG. 1.

After formation of the conductors 3,4,5, an etch stop layer 12 is applied to the top surface portion 6 and the sidewall portions 7 of the conductors 3,4,5 and to those portions of the semiconductor substrate 1 which are not covered by the conductors 3,4,5. In accordance with the invention, the etch stop layer 12 is composed of silicon carbide, which layer can be deposited by means of, for example, chemical vapor deposition (CVD). The thickness of the etch stop layer 12 may be, for example, in the range between about 10 nm and 100 nm. Alternatively, a stack consisting of a layer of aluminum, a layer of titanium, a layer of titanium nitride and a layer of silicon carbide may be deposited and subsequently patterned. In that case, the etch stop layer 12 of silicon carbide would only be present at the top surface portion 6 of the conductors 3,4,5, whereas the sidewall portions 7 of the conductors 3,4,5 would not be covered by the etch stop layer 12.

Figure 2:
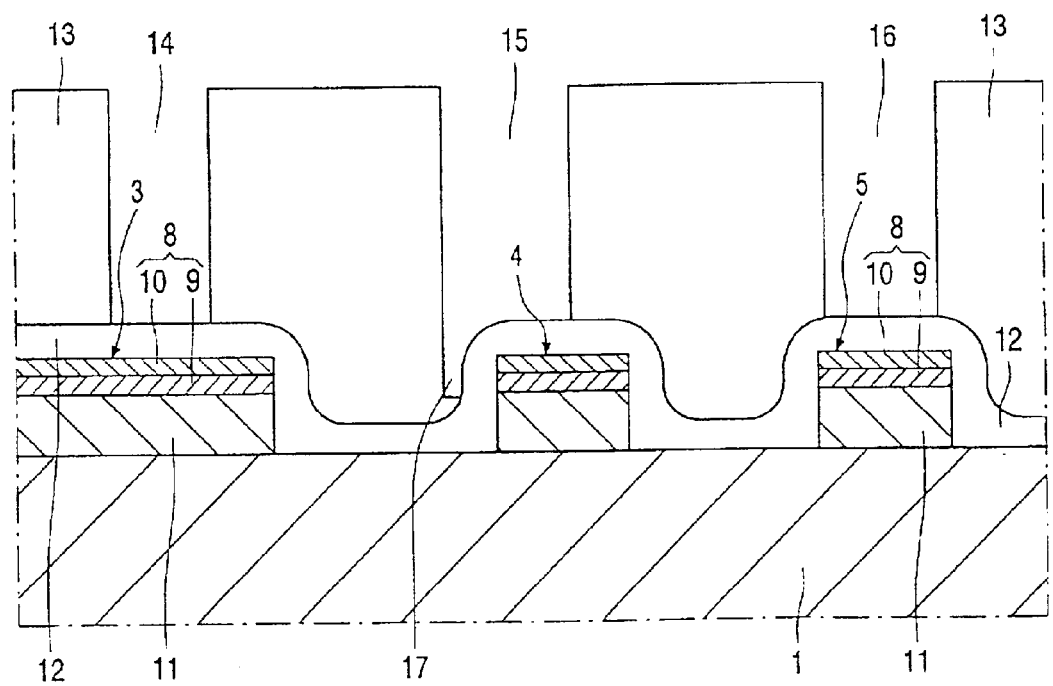

After deposition of the etch stop layer 12 composed of silicon carbide, a dielectric layer 13 is deposited on the etch stop layer 12 (FIG. 2). The dielectric layer 13 may be composed of silicon oxide. However, it is advantageously composed of a material having a dielectric constant lower than that of silicon oxide such as, for example, hydrogen silsesquioxane, parylene, a fluorinated polyimide, or "SILK©" which is marketed by Dow Chemical from Midland, Mich., USA. Such dielectric layer can be deposited by a conventional deposition technique such as, for example, spin-coating.

After deposition, the dielectric layer 13, which is composed of hydrogen silsesquioxane in the present example, is patterned so as to form vias 14,15,16 overlying the conductors 3,4,5. Patterning is accomplished using conventional photolithographic techniques, wherein a photoresist layer (not shown) is deposited on the dielectric layer 13, which photoresist layer is selectively exposed to radiation and developed in order to form a resist mask (not shown) having openings which expose the dielectric layer 13 in the areas of the vias 14,15,16 to be formed. Subsequently, the vias 14,15,16 are etched by removing the unmasked areas of the dielectric layer 13.

Etching of the vias 14,15,16 is continued until all of the dielectric layer 13 has been removed from above the conductors 3,4,5 in the unmasked via areas. In case of differential thicknesses of the dielectric layer 13, which typically occur across the semiconductor device, certain vias may be exposed to the etch chemistry for a prolonged period of time, such that an over-etch occurs. During such over-etch, metallic polymers may be formed due to interaction between the etch chemistry applied and the material of the conductors exposed inside these vias. Moreover, if a via is slightly misaligned, which is the case for via 15 overlying conductor 4 (FIG. 2), the over-etch will result in formation of a trench 17 along at least one of the sidewall portions 7 of the conductor 4. Such misaligned via, also being referred to as unlanded via, potentially falls off the conductor instead of completely landing on the top surface portion of the conductor. If the over-etch is severe in case of such unlanded via, the trench 17 may even reach the semiconductor substrate 1, which may be locally composed of conductive material as well. Attack of such semiconductor substrate 1 during via etching may also result in the formation of metallic polymers. However, in order to counteract the above-mentioned problems, via etching is performed selectively to the etch stop layer 12 of silicon carbide, which etch stop layer 12 is present on the top surface portion 6 and the sidewall portions 7 of the conductors 3,4,5 and the portions of the semiconductor substrate 1 not covered by the conductors 3,4,5. Hence, an over-etch does not expose the semiconductor substrate 1, nor any portions, whether top surface portions or sidewall portions, of the conductors 3,4,5. Formation of metallic polymers through interaction between the etch chemistry used during via etching and the material of the conductors 3,4,5 or the semiconductor substrate 1 is thus counteracted.

To achieve the above-mentioned selectivity of via etching, an etch chemistry is used which etches the dielectric layer 13, in the present example composed of hydrogen silsesquioxane, much faster than the etch stop layer 12 composed of silicon carbide. A suitable etch chemistry, which may be used to form vias 14,15,16 while stopping on the etch stop layer 12 is, for example, a fluorine carbon dry etch chemistry. In this way, the etch stop layer 12 of silicon carbide is exposed inside the vias 14,15,16.

Figure 3:
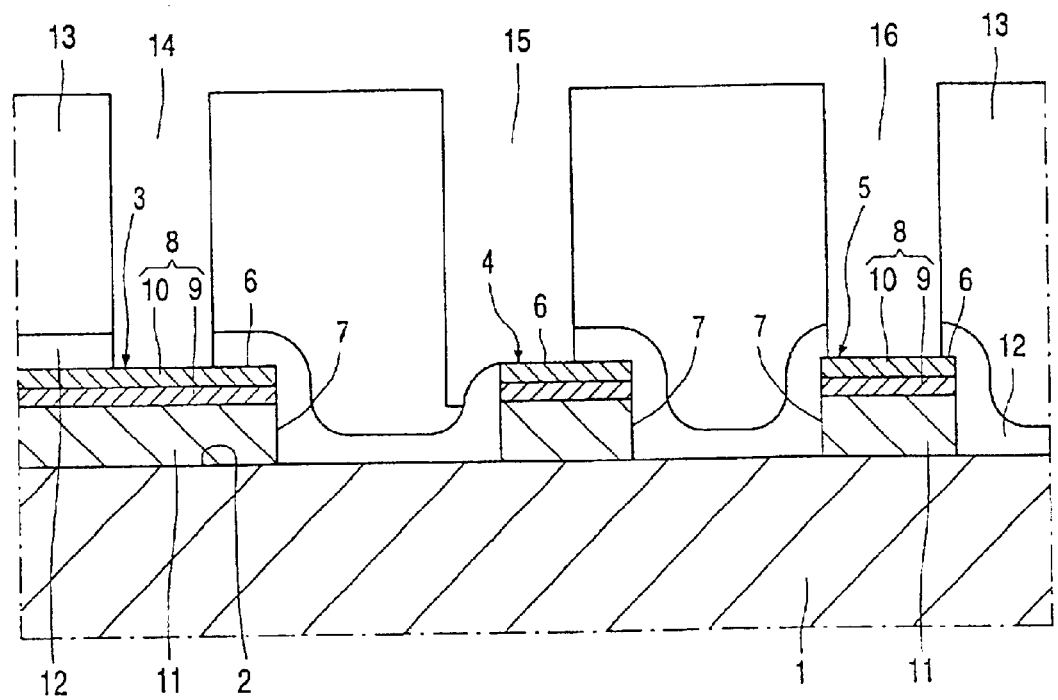

In order to make contact to the conductors 3,4,5, the exposed parts of the etch stop layer 12 of silicon carbide need to be removed inside the vias 14,15,16 (FIG. 3). The etch stop layer 12 exposed inside the vias 14,15,16 can be removed from the top surface portion 6 of the conductors 3,4,5 as well as from the at least one of the sidewall portions 7 of the conductor 4, over which the unlanded via 15 lies. However, the etch stop layer 12 of silicon carbide is advantageously removed from only the top surface portion 6 of the conductors 3,4,5, which removal is advantageously carried out anisotropically using, for example, a fluorine carbon dry etch chemistry. As illustrated in FIG. 3, an anisotropic etch removes the exposed parts of the etch stop layer 12 from the top surface portion 6 of the conductors 3,4,5, while only recessing the exposed parts of the etch stop layer 12 along the at least one of the sidewall portions 7 of the conductor 4. As the thickness of the etch stop layer 12 of silicon carbide, which may be somewhere between about 10 nm and 100 nm, is relatively small and relatively uniform across the semiconductor device, it can be removed in a very controlled way without causing severe interaction between the etch chemistry applied and the material of the conductors 3,4,5 and, hence, without causing severe formation of metallic polymers.

In the present example, the capping layer 8, which consists of a titanium layer 9 with on top thereof a titanium nitride layer 10, is left in place inside the vias 14,15,16 after removal of the etch stop layer 12 from the top surface portion 6 of the conductors 3,4,5. However, in case the capping layer 8 consists of a single layer of, for example, titanium nitride, titanium tungsten, tungsten nitride or tantalum nitride, it is advantageously removed from inside the vias 14,15,16 prior to the vias 14,15,16 being filled with conductive material, as high-resistant material may be formed due to interaction between the base metal portion 11 and the capping layer 8, which high-resistant material adversely affects the electrical via resistance.

Figure 4:
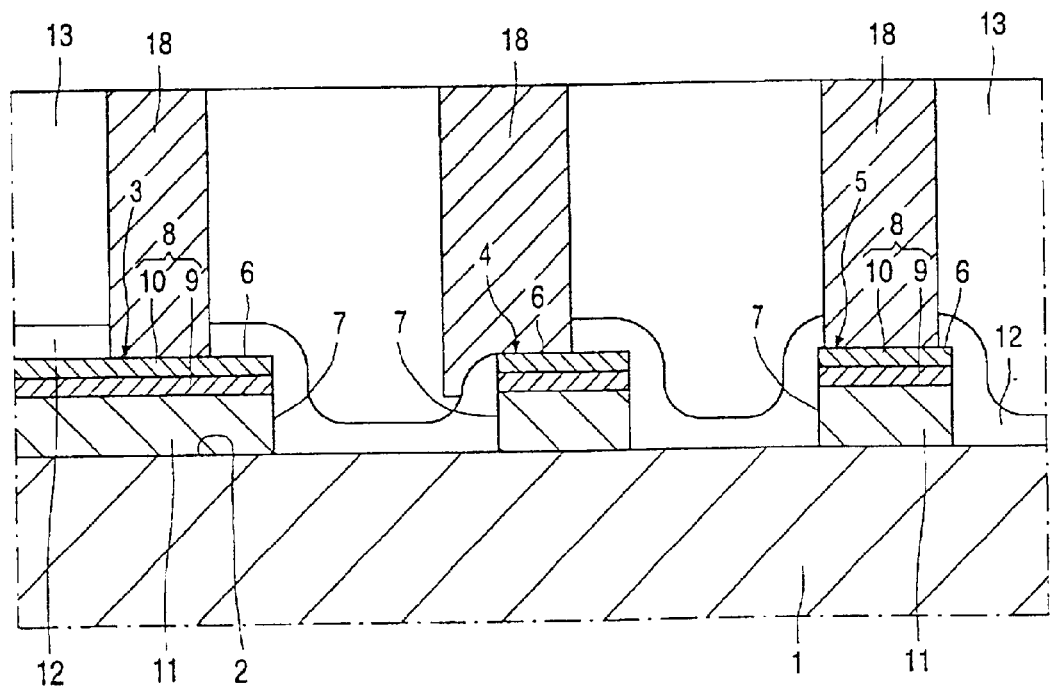

In a next step (FIG. 4), the vias 14,15,16 are filled with a conductive material 18 by means of, for example, deposition of a layer of, for example, aluminum, copper or tungsten. It is noted that the layer of conductive material is advantageously applied as a double-layer consisting of a layer comprising the metal such as, for example, aluminum, copper or tungsten, on top of a layer acting as an adhesion layer and/or barrier layer. In this respect titanium may be applied as an adhesion layer and titanium nitride or titanium tungsten as a barrier layer. The deposited layer of conductive material may subsequently be etched while using an over-sized mask. In the present example, however, the deposited layer of conductive material is masklessly removed until the dielectric layer 13 is exposed, as is shown in FIG. 4.

Maskless removal of the layer of conductive material can be accomplished by means of, for example, chemical-mechanical polishing (CMP) e.g. using a commercially available slurry.

It will be apparent that the invention is not limited to the embodiments described above, but that to those skilled in the art many variations are possible within the scope of the invention.

What is claimed is:

1. A method of manufacturing an electronic device, a semiconductor device in particular but not exclusively, which method comprises the steps of:

applying a semiconductor substrate which is provided with a conductor at a surface, the conductor having a top surface portion and sidewall portions, of which at least the top surface portion is provided with an etch stop layer comprising silicon carbide;

applying a dielectric layer, etching a via in the dielectric layer over the conductor, and stopping on the etch stop layer to create an exposed part of the etch stop layer;

removing the exposed part of the etch stop layer inside the via from at least the top surface portion of the conductor; and filling the via with a conductive material;

wherein the etch stop layer is applied to the top surface portion and the sidewall portions of the conductor after the provision of the conductor at the surface of the semiconductor substrate.

2. A method as claimed in claim 1, characterized in that the via is etched while overhanging at least one of the sidewall portions of the conductor and exposing at least part of the etch stop layer, which etch stop layer covers the top surface portion and the at least one of the sidewall portions of the conductor.

3. A method as claimed in claim 2, characterized in that the etch stop layer is removed from inside the via from only the top surface portion of the conductor.

4. A method as claimed in claim 1, characterized in that the etch stop layer is applied to the top surface portion and the sidewall portions of the conductor as well as to portions of the semiconductor substrate which are not covered by the conductor.

5. A method as claimed in claim 1, characterized in that the conductor is provided while comprised at least in part of a material selected from a group comprising aluminum, copper and tungsten.

6. A method as claimed in claim 1, characterized in that the conductor is provided comprising a capping layer, which capping layer provides the top surface portion of the conductor.

7. A method as claimed in claim 6, characterized in that the capping layer is comprised of a material selected from a group comprising titanium nitride, titanium tungsten and tantalum nitride.

8. A method as claimed in claim 1, characterized in that the dielectric is applied by depositing a dielectric material having a dielectric constant lower than that of silicon oxide.

9. A method as claimed in claim 8, characterized in that the dielectric layer is applied by depositing a material selected from a group comprising hydrogen silsesquioxane, parylene and a fluorinated polyimide.

10. A method as claimed in claim 1, characterized in that the via is filled by depositing a conductive layer, which conductive layer comprises a metal selected from a group comprising aluminum, copper and tungsten.

11. The method of claim 1, wherein a capping layer immediately adjoins said etch stop layer.

12. A method of forming electrically conductive pathways, comprising:

forming a patterned conductor on a substrate, the patterned conductor having sidewalls and a top surface, the patterned conductor further having an electrically conductive capping layer disposed on the top surface thereof, the capping layer having a top surface and sidewalls;

forming a conformal etch stop layer such that the etch stop layer is in contact with at least the substrate, the sidewalls of the patterned conductor, and the top surface and sidewalls of the capping layer;

forming a dielectric layer over the etch stop layer;

forming a via opening in the dielectric layer, the via opening exposing a portion of the etch stop layer, the via opening at least partially overlapping the at least one patterned conductor;

anisotropically etching the exposed portion of the etch stop layer such that at least a portion of the capping layer is exposed; and filling the via opening with electrically conductive material.

13. The method of claim 12, wherein the via opening is unlanded, and wherein the electrically conductive material in the via opening is spaced away from the patterned conductor sidewalls and the capping layer sidewalls by the etch stop layer adjacent the sidewalls of the patterned conductor and the sidewalls of the capping layer.

14. The method of claim 13, wherein the etch stop layer comprises silicon carbide.

15. The method of claim 14, wherein the capping layer comprises a titanium layer disposed on the top surface of the patterned conductor, and the capping layer further comprises a titanium nitride layer over the titanium layer.

* * * * *